US011532586B2

(12) United States Patent
Tseng et al.

(10) Patent No.: US 11,532,586 B2
(45) Date of Patent: Dec. 20, 2022

(54) CONNECTING TECHNIQUES FOR STACKED SUBSTRATES

(71) Applicant: Taiwan Semiconductor Manufacturing Co., Ltd., Hsin-Chu (TW)

(72) Inventors: Hsiang-Jen Tseng, Hsinchu (TW); Wei-Yu Chen, Hsinchu (TW); Ting-Wei Chiang, New Taipei (TW); Li-Chun Tien, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 16/587,568

(22) Filed: Sep. 30, 2019

(65) Prior Publication Data
US 2020/0027854 A1     Jan. 23, 2020

Related U.S. Application Data

(60) Division of application No. 15/846,756, filed on Dec. 19, 2017, now Pat. No. 10,497,661, which is a
(Continued)

(51) Int. Cl.
*H01L 23/00* (2006.01)
*H01L 25/065* (2006.01)
(Continued)

(52) U.S. Cl.
CPC ............ *H01L 24/25* (2013.01); *H01L 21/743* (2013.01); *H01L 21/76838* (2013.01);
(Continued)

(58) Field of Classification Search
CPC ..... H01L 24/25; H01L 25/074; H01L 23/535; H01L 21/743; H01L 24/73; H01L 23/481;
(Continued)

(56) References Cited

U.S. PATENT DOCUMENTS 6,031,271 A  2/2000 Imai
6,031,445 A  2/2000 Marty et al.
(Continued)

OTHER PUBLICATIONS

Non-Final Office Action dated Apr. 3, 2015 for U.S. Appl. No. 14/102,548.
(Continued)

*Primary Examiner* — Patricia D Valenzuela
(74) *Attorney, Agent, or Firm* — Eschweiler & Potashnik, LLC

(57) ABSTRACT

The present disclosure, in some embodiments, relates to a method of forming an integrated chip. The method may be performed by forming a first device tier including a first semiconductor substrate having a first plurality of devices. A second semiconductor substrate is formed over the first device tier. A first conductive layer is formed within the second semiconductor substrate, and a second conductive layer is formed within the second semiconductor substrate and over the first conductive layer. The first conductive layer and the second conductive layer have different patterns as viewed from a top-view. A second plurality of devices are formed on the second semiconductor substrate. The first and second conductive layers are configured to electrically couple the first plurality of devices and the second plurality of devices.

20 Claims, 7 Drawing Sheets

Related U.S. Application Data division of application No. 15/219,357, filed on Jul. 26, 2016, now Pat. No. 9,853,008, which is a continuation of application No. 14/102,548, filed on Dec. 11, 2013, now Pat. No. 9,443,758.

(51) Int. Cl.

| | | |
|---|---|---|
| *H01L 23/528* | (2006.01) | |
| *H01L 25/00* | (2006.01) | |
| *H01L 21/768* | (2006.01) | |
| *H01L 23/48* | (2006.01) | |
| *H01L 21/822* | (2006.01) | |
| *H01L 27/06* | (2006.01) | |
| *H01L 23/535* | (2006.01) | |
| *H01L 21/74* | (2006.01) | |
| *H01L 25/07* | (2006.01) | |
| *H01L 27/118* | (2006.01) | |
| *H01L 23/522* | (2006.01) | |
| *H01L 23/532* | (2006.01) | |

(52) U.S. Cl.
CPC ........ *H01L 21/8221* (2013.01); *H01L 23/481* (2013.01); *H01L 23/528* (2013.01); *H01L 23/535* (2013.01); *H01L 24/29* (2013.01); *H01L 24/32* (2013.01); *H01L 24/48* (2013.01); *H01L 24/73* (2013.01); *H01L 24/83* (2013.01); *H01L 25/0652* (2013.01); *H01L 25/0657* (2013.01); *H01L 25/074* (2013.01); *H01L 25/50* (2013.01); *H01L 27/0688* (2013.01); *H01L 21/76898* (2013.01); *H01L 23/522* (2013.01); *H01L 23/53223* (2013.01); *H01L 23/53238* (2013.01); *H01L 23/53252* (2013.01); *H01L 23/53266* (2013.01); *H01L 24/13* (2013.01); *H01L 2027/11887* (2013.01); *H01L 2224/48227* (2013.01); *H01L 2225/06527* (2013.01); *H01L 2225/06541* (2013.01); *H01L 2225/06548* (2013.01); *H01L 2924/00014* (2013.01); *H01L 2924/13091* (2013.01); *H01L 2924/207* (2013.01)

(58) Field of Classification Search
CPC ......... H01L 24/83; H01L 24/48; H01L 24/29; H01L 24/32; H01L 25/0657; H01L 27/0688; H01L 21/8221; H01L 25/0652; H01L 23/528; H01L 25/50; H01L 21/76838; H01L 2027/11887; H01L 2924/207; H01L 2924/00014; H01L 2924/13091; H01L 23/522; H01L 23/53223; H01L 23/53238; H01L 23/53252; H01L 23/53266; H01L 2225/06527; H01L 2225/06548; H01L 21/8238; H01L 27/0922; H01L 24/13; H01L 21/76898

See application file for complete search history.

(56) References Cited

U.S. PATENT DOCUMENTS

| | | | |
|---|---|---|---|
| 6,034,438 | A | 3/2000 | Petersen |
| 7,368,788 | B2 | 5/2008 | Huo et al. |
| 7,528,494 | B2 | 5/2009 | Furukawa et al. |
| 7,944,058 | B2 | 5/2011 | Ishihara |
| 8,022,524 | B2 | 9/2011 | Sato |
| 8,026,612 | B2 | 9/2011 | Maebashi et al. |
| 8,138,594 | B2 | 3/2012 | Tanaka |
| 8,159,058 | B2 | 4/2012 | Ishikawa et al. |
| 8,183,465 | B2 | 5/2012 | Suzuki et al. |
| 8,510,699 | B1 | 8/2013 | Acar et al. |
| 8,535,989 | B2 | 9/2013 | Sankman et al. |
| 8,536,700 | B2 | 9/2013 | Sabatini et al. |
| 8,541,819 | B1 | 9/2013 | Or-Bach et al. |
| 8,557,632 | B1 | 10/2013 | Or-Bach et al. |
| 8,558,356 | B2 | 10/2013 | Kiwitt et al. |
| 8,563,403 | B1 | 10/2013 | Farooq et al. |
| 8,618,654 | B2 | 12/2013 | Sutardja et al. |
| 8,637,995 | B2 | 1/2014 | Sadaka |
| 8,749,077 | B2 | 6/2014 | Wu et al. |
| 8,780,576 | B2 | 7/2014 | Haba et al. |
| 8,810,006 | B2 | 8/2014 | Yu et al. |
| 8,816,506 | B2 | 8/2014 | Kawashita et al. |
| 8,952,540 | B2 | 2/2015 | Roy et al. |
| 9,041,211 | B2 | 5/2015 | Uchiyama |
| 9,443,758 | B2 | 9/2016 | Tseng et al. |
| 9,853,008 | B2 | 12/2017 | Tseng et al. |
| 2001/0002727 | A1 | 6/2001 | Shiraishi et al. |
| 2002/0102750 | A1 | 8/2002 | Wang |
| 2002/0115257 | A1 | 8/2002 | Inagawa et al. |
| 2002/0159242 | A1 | 10/2002 | Nakatani et al. |
| 2004/0090758 | A1 | 5/2004 | Horikawa |
| 2004/0238941 | A1 | 12/2004 | Satoh et al. |
| 2005/0098805 | A1 | 5/2005 | Okita et al. |
| 2005/0104204 | A1 | 5/2005 | Kawakubo et al. |
| 2005/0127437 | A1 | 6/2005 | Inagawa et al. |
| 2006/0043571 | A1 | 3/2006 | Mousa et al. |
| 2006/0192282 | A1 | 8/2006 | Suwa et al. |
| 2006/0267010 | A1 | 11/2006 | Matsubara et al. |
| 2007/0018313 | A1 | 1/2007 | Gomyo et al. |
| 2007/0049016 | A1 | 3/2007 | Hiatt et al. |
| 2007/0052103 | A1 | 3/2007 | Lee et al. |
| 2007/0096158 | A1 | 5/2007 | Komaki |
| 2007/0145518 | A1 | 6/2007 | Mihara |
| 2007/0182000 | A1 | 8/2007 | Higashitani et al. |
| 2007/0222065 | A1 | 9/2007 | Andry et al. |
| 2007/0278670 | A1 | 12/2007 | Kimura et al. |
| 2008/0237862 | A1 | 10/2008 | Tanaka |
| 2008/0248656 | A1 | 10/2008 | Chen et al. |
| 2009/0050941 | A1 | 2/2009 | Yamazaki et al. |
| 2009/0142888 | A1 | 6/2009 | Tsuchiya |
| 2009/0206477 | A1 | 8/2009 | Maebashi et al. |
| 2010/0040982 | A1 | 2/2010 | Liu et al. |
| 2010/0225002 | A1* | 9/2010 | Law .................. H01L 21/76898 257/774 |
| 2011/0155433 | A1 | 6/2011 | Funaya et al. |
| 2011/0156026 | A1 | 6/2011 | Yamazaki et al. |
| 2011/0156195 | A1 | 6/2011 | Tivarus et al. |
| 2011/0156197 | A1 | 6/2011 | Tivarus et al. |
| 2011/0248335 | A1 | 10/2011 | Higashida |
| 2011/0248403 | A1 | 10/2011 | Chandrasekaran et al. |
| 2012/0032345 | A1 | 2/2012 | Strukov et al. |
| 2012/0061764 | A1 | 3/2012 | Lum et al. |
| 2012/0112324 | A1* | 5/2012 | Huang .................. H01L 23/481 257/621 |
| 2012/0126425 | A1 | 5/2012 | Farooq et al. |
| 2012/0193719 | A1 | 8/2012 | Or-Bach et al. |
| 2012/0223436 | A1 | 9/2012 | Sekar et al. |
| 2012/0228713 | A1 | 9/2012 | Chen et al. |
| 2012/0267776 | A1 | 10/2012 | Nin |
| 2012/0306082 | A1 | 12/2012 | Sekar et al. |
| 2012/0313227 | A1 | 12/2012 | Or-Bach et al. |
| 2013/0095580 | A1 | 4/2013 | Or-Bach et al. |
| 2013/0119548 | A1 | 5/2013 | Avouris et al. |
| 2013/0120951 | A1 | 5/2013 | Zuo et al. |
| 2013/0122672 | A1 | 5/2013 | Or-Bach et al. |
| 2013/0193584 | A1 | 8/2013 | Ding et al. |
| 2014/0021591 | A1 | 1/2014 | Sung et al. |
| 2014/0124927 | A1 | 5/2014 | Lin et al. |
| 2014/0145272 | A1 | 5/2014 | Or-Bach et al. |
| 2014/0223389 | A1 | 8/2014 | Liao et al. |
| 2014/0232011 | A1 | 8/2014 | Tsumura |
| 2014/0264474 | A1 | 9/2014 | Chu et al. |
| 2014/0264744 | A1 | 9/2014 | Chu et al. |
| 2014/0264871 | A1 | 9/2014 | Lee |
| 2015/0021578 | A1 | 1/2015 | Nakamura |

(56) References Cited

U.S. PATENT DOCUMENTS

2015/0228572 A1    8/2015  Yang et al.
2018/0190708 A1    7/2018  Lee et al.

OTHER PUBLICATIONS

Final Office Action dated Aug. 21, 2015 for U.S. Appl. No. 14/102,548.
Non-Final Office Action dated Oct. 28, 2015 for U.S. Appl. No. 14/102,548.
Final Office Action dated Mar. 3, 2016 for U.S. Appl. No. 14/102,548.
Notice of Allowance dated May 11, 2016 for U.S. Appl. No. 14/102,548.
Notice of Allowance dated Aug. 14, 2017 for U.S. Appl. No. 14/102,548.
Non-Final Office Action dated Oct. 4, 2018 for U.S. Appl. No. 15/846,756.
Final Office Action dated Apr. 17, 2019 for U.S. Appl. No. 15/846,756.
Notice of Allowance dated Aug. 2, 2019 for U.S. Appl. No. 15/846,756.

* cited by examiner

US 11,532,586 B2

CONNECTING TECHNIQUES FOR STACKED SUBSTRATES

REFERENCE TO RELATED APPLICATIONS

This Application is a Divisional of U.S. application Ser. No. 15/846,756, filed on Dec. 19, 2017, which is a Divisional of U.S. application Ser. No. 15/219,357, filed on Jul. 26, 2016 (now U.S. Pat. No. 9,853,008, issued on Dec. 26, 2017), which is a Continuation of U.S. application Ser. No. 14/102,548, filed on Dec. 11, 2013 (now U.S. Pat. No. 9,443,758, issued on Sep. 13, 2016). The contents of the above-referenced Patent Applications are hereby incorporated by reference in their entirety.

BACKGROUND

A stacked CMOS chip is a kind of integrated circuit having multiple device tiers which are vertically stacked and which share one package. Stacked CMOS chips extend chip structure to three dimensions and increase the number of CMOS devices that can be "squeezed" into a given footprint.

DETAILED DESCRIPTION

Figure 1:
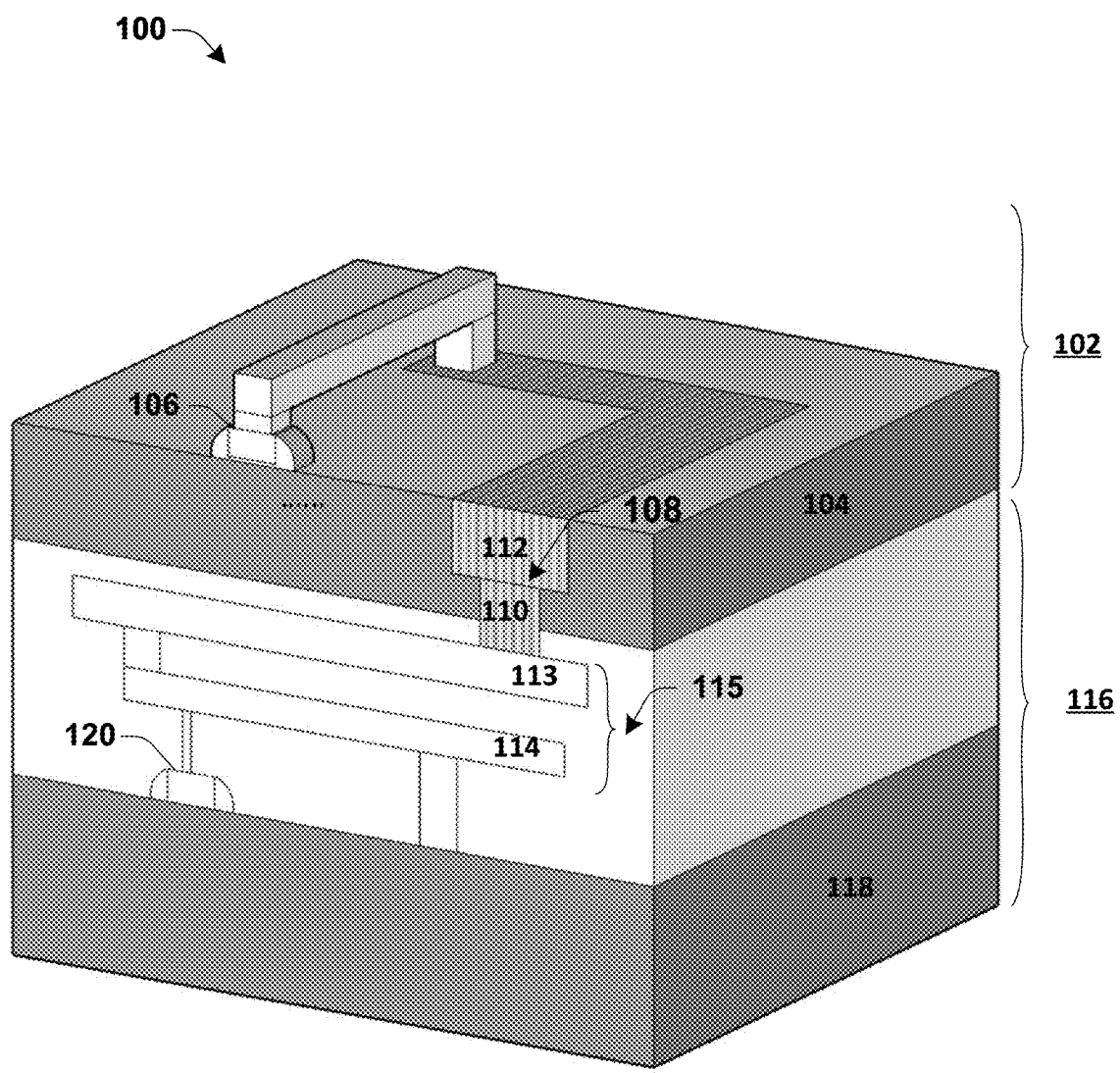
FIG. 1 illustrates a perspective-sectional view of a stacked CMOS device in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Relative to packaging solutions where multiple chips are arranged in separate horizontally spaced packages, stacked CMOS devices (which include multiple chips that are vertically "stacked" over one another in a single package), shrink the lateral footprint for the circuits when arranged within a product. However, the vertical dimension of stacked CMOS devices can become an issue in some applications. For example, stacked CMOS chips can be too thick for some ultra-thin apparatuses, such as cell phones or portable entertainment units. In addition, forming electrical connections between different vertical device tiers requires alignment of corresponding contact points on the corresponding device tiers, which limits flexibility in structure design. Therefore, in a stacked semiconductor integrated circuit in accordance with some embodiments, instead of connecting multiple tiers solely by a vertical interwafer via, a multi-layer horizontal connecting structure is fabricated inside a substrate of an individual device tier. Individual layers of the multi-layer horizontal connecting structure have different patterns as viewed from above the substrate. Relative to conventional approaches, stacked CMOS devices with multi-layer horizontal connecting structures provide several advantages. For example, locations of electrical contact points of different tiers are flexible, metal usage for electrical path layers is reduced, and the number of and/or thickness of electrical path layers is decreased which tends to "thin down" chip thickness. Power dissipation is also reduced.

FIG. 1 illustrates a perspective-sectional view of a stacked CMOS device 100 in accordance with some embodiments. The stacked CMOS device 100 includes multiple device tiers, such as a first device tier 102 and a second device tier 116. The first device tier 102 comprises a first substrate 104 and a first plurality of devices 106. The second device tier 116 comprises a second substrate 118 and a second plurality of devices 120. A first inter-tier horizontal interconnecting structure 108 is formed at least partially inside the first substrate 104. The first inter-tier horizontal structure 108 electrically connects one or more devices, such as device 106, on the first substrate 104, to one or more devices, such as device 120, on the second substrate 118. The first inter-tier horizontal interconnecting structure 108 can comprises multiple conductive layers, such as metal layers, with different patterns as viewed from above the first substrate.

The first inter-tier horizontal structure 108 includes a first conductive layer 110, which takes the form of a vertical connection element in this example. The first conductive layer 110 is coupled to a second conductive layer 112, which takes the form of a first horizontal layer in this example. The second conductive layer 112, which takes the form of a first horizontal layer in this example, is disposed above the first vertical connection element 110 and is connected to a device of the first plurality of devices 106 or other contact paths on the first device tier 102, for example, power, ground or signal pins. The second conductive layer 112 is electrically coupled to the device of the second device tier 116 by the first vertical connection element 110. The first conductive layer 110 couples the second conductive layer 112 (and hence device 106) to an electrical interconnect structure 115 on the second device tier 116. The electrical interconnect structure 115 has multiple metal layers, such as 113 and 114. These metal layers 113 and 114 are arranged under a back side of the first substrate 104 and are coupled to a device 120 of the second device tier 116. The electrical interconnect structure 115 can also be coupled to other contact points of the second device tier 116 stacked under the first device tier 102. The electrical interconnect structure 115 can either be formed in a dielectric layer between the first tier 102 and the second tier 116 or can be coupled into the second tier 116.

The first plurality of devices 106 on the first substrate 104 and the second plurality of devices 120 on the second substrate 118 can be two dimensional structures (e.g., planar MOSFETs) or three dimensions structures (e.g., silicon on insulator (SOI) devices or FinFET devices). The first inter-tier horizontal interconnecting structure 108 in the first substrate 104 can be copper, silver, tungsten or aluminum with a tantalum (Ta), titanium (Ti), tantalum nitride (TaN), titanium tungsten (TiW), titanium tungsten nitride (TiWN), or titanium nitride (TiN) barrier for preventing metal diffusions. A dielectric layer is formed surrounding the barrier layer for electrical isolation. The first substrate 104 can be either bulk Silicon or epitaxial Silicon on a dielectric material. To further reduce metal material, reduce layers, or decrease complexity of the electrical interconnect structure 115, the first device tier 102 can have devices on both sides. The first device tier 102 can also be "flipped" over relative to what is shown in FIG. 1 so that a top side of the first substrate 104 with the first plurality of devices 106 is proximate to a top side of the second substrate 118 with the second plurality of devices 120. In such way, electrical connections between the first plurality of devices 106 and the second plurality of devices 120 become more flexible. The first device tier 102 can be formed onto the second device tier 116 by deposition, spray coated, curtain coated, or spin coated. The first device tier 102 can also be bonded to the second device tier 116.

Thus, FIG. 1 shows an example of a stacked CMOS device 100 with two device tiers (e.g., 102, 116) connected by a multi-layer inter-tier horizontal interconnecting structure 108 in accordance with some embodiments. Some advantages of this structure include improved placement and routing flexibility and reduced metal usage and further reduction of area and power consumption of the circuit.

Figure 2:
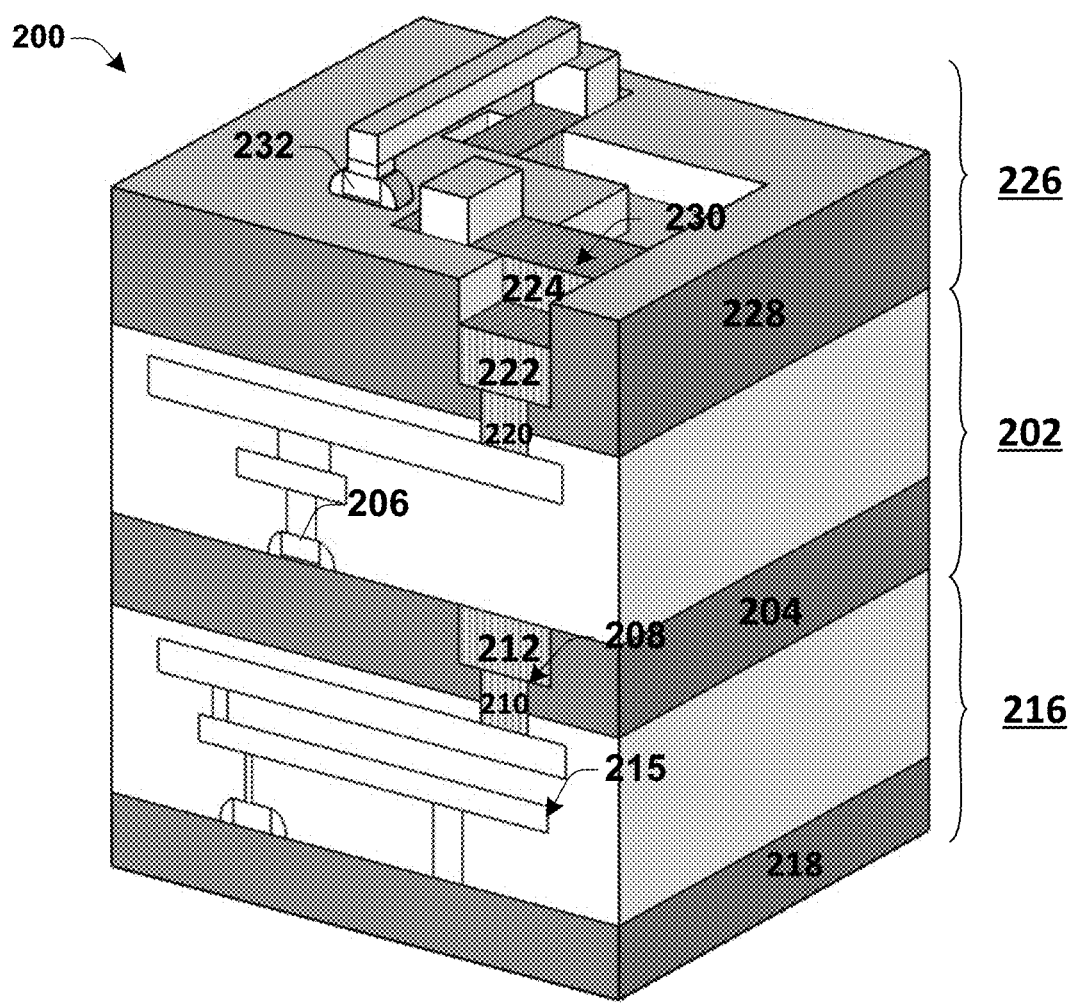
FIG. 2 illustrates a perspective-sectional view of a stacked CMOS device in accordance with some alternative embodiments.
Figure 3:
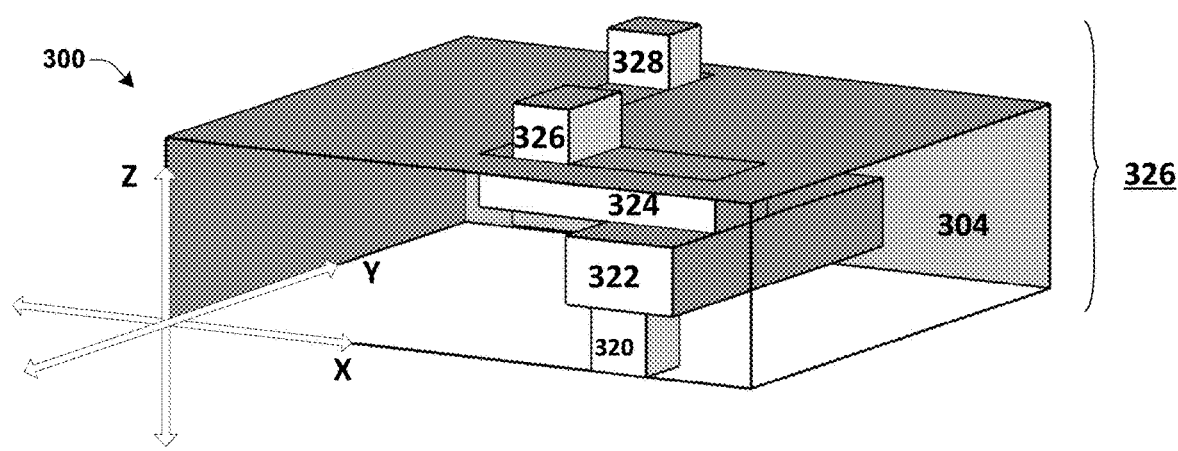
FIG. 3 and FIG. 4 illustrate perspective-sectional views of a three-step structure of a horizontal connecting structure and a four-step structure of a horizontal connecting structure.

FIG. 2 illustrates a perspective-sectional view of a stacked CMOS device 200 in accordance with some alternative embodiments. The stacked CMOS device 200 shows example embodiments of disclosure that a third device tier 226 with a third substrate 228 and a third plurality of devices (e.g., 232) can be stacked onto a first device tier 202 and a second device tier 216 similar to 102 and 116 in FIG. 1. More tiers can be stacked onto the third device tier 226. A second horizontal connecting structure 230 inside the third substrate 218 comprises three layers 220, 222 and 224 and electrically connects the first device tier 202 and the third device tier 226 of which a detailed example perspective-sectional view is shown in FIG. 3. Notably, the first substrate 204 with the first horizontal connecting structure and the third substrate 228 with the second horizontal connecting structure can have similar or different structure. Horizontal connecting structures can have same or different numbers of conductive layers. Patterns of conductive layers can also be different. Thus, FIG. 2 shows another example semiconductor integrated circuit with more than two device tiers connected by multi-layer inter-tier horizontal interconnecting structures in accordance with some alternative embodiments.

FIG. 3 illustrates a perspective-sectional view of an example three-layer structure of a horizontal connecting structure. The horizontal connecting structure can be used as either the first horizontal connecting structure 208 or the second horizontal connecting structure 230 in FIG. 2. In the example, a first conductive layer 320 is a first vertical connection element electrically coupled to a device of a device tier thereunder. A second conductive layer 322 is a first horizontal layer disposed above the first vertical connection element 320 and a third conductive layer 324 is a second horizontal layer disposed above the first horizontal layer 322 and electrically coupled to a device on a substrate 304 of a device tier 326 thereon through both the first conductive layer 320 and the second conductive layer 322. A location of at least a portion of the first conductive layer 320 shifts horizontally to a location of the second conductive layer 322 or the third conductive layer 324. The first conductive layer 320 connects contact points such as 326 and 328 on the other side of a substrate 304 not vertically aligned with a location of the first conductive layer 320 through the second conductive layer 322 and the third conductive layer 324. The first conductive layer 320, which is a vertical connection element in the illustrated example, can have a square-like or rounded perimeter as viewed from above and can fall within edges of second conductive layer. In some embodiments, 320 is formed along Z direction, 322 is formed along Y direction, 324 is formed along X direction. In some embodiments, 320, 322, 324 are in perpendicular with each other in respective X, Y, Z direction. In some embodiments, 304 includes any number of conductive layers. In some embodiments, any two conductive layers of the conductive layers in 304 are in parallel or in perpendicular with each other.

Figure 4:
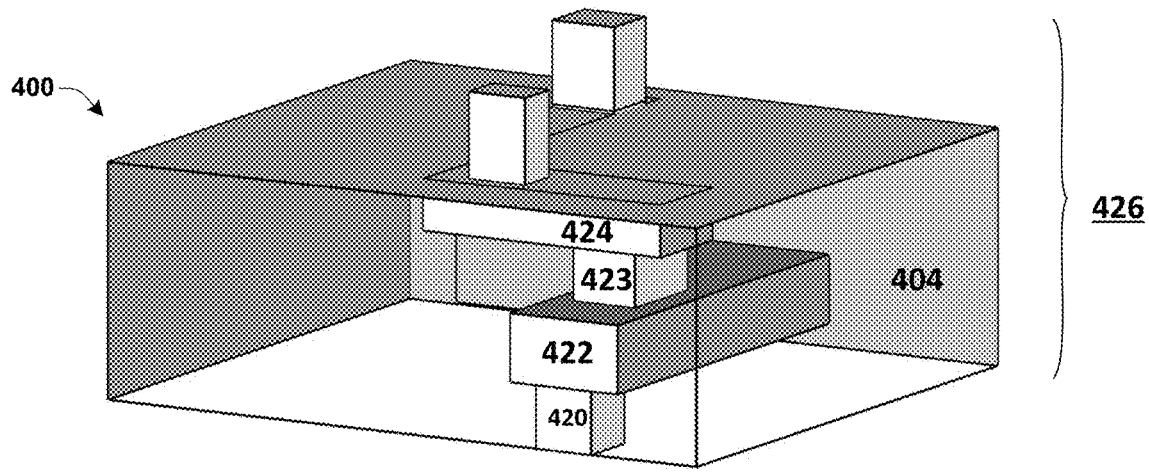

FIG. 4 illustrates a perspective-sectional view of a four-layer horizontal connecting structure 400 comprising an additional fourth conductive layer. The four layer horizontal connecting structure 400 can be used as either the first horizontal connecting structure 208 or the second horizontal connecting structure 230 in FIG. 2. In FIG. 4's example, a first conductive layer 420 is a first vertical connection element extending in the z-direction and which is electrically coupled to a device of a device tier (not shown) thereunder. A second conductive layer 422 is a first horizontal layer disposed above the first vertical connection element 420 and extending in the y-direction. A third conductive layer 423 is a second vertical connection element connecting the second conductive layer 422 to a fourth conductive layer 424. The fourth conductive layer 424 is a second horizontal layer which extends in the x direction and which is disposed above the second vertical connection element 423. The first conductive layer 420 is electrically coupled to a device on a substrate 404 of device tier 426 through the second conductive layer 422, the third conductive layer 423, and the fourth conductive layer 424. Structures of FIG. 3 and FIG. 4 can be applied to any upper level tier (e.g. the tier 102 of 100 and tier 202 or 226 of 200) of disclosed stacked CMOS devices.

Figure 5:
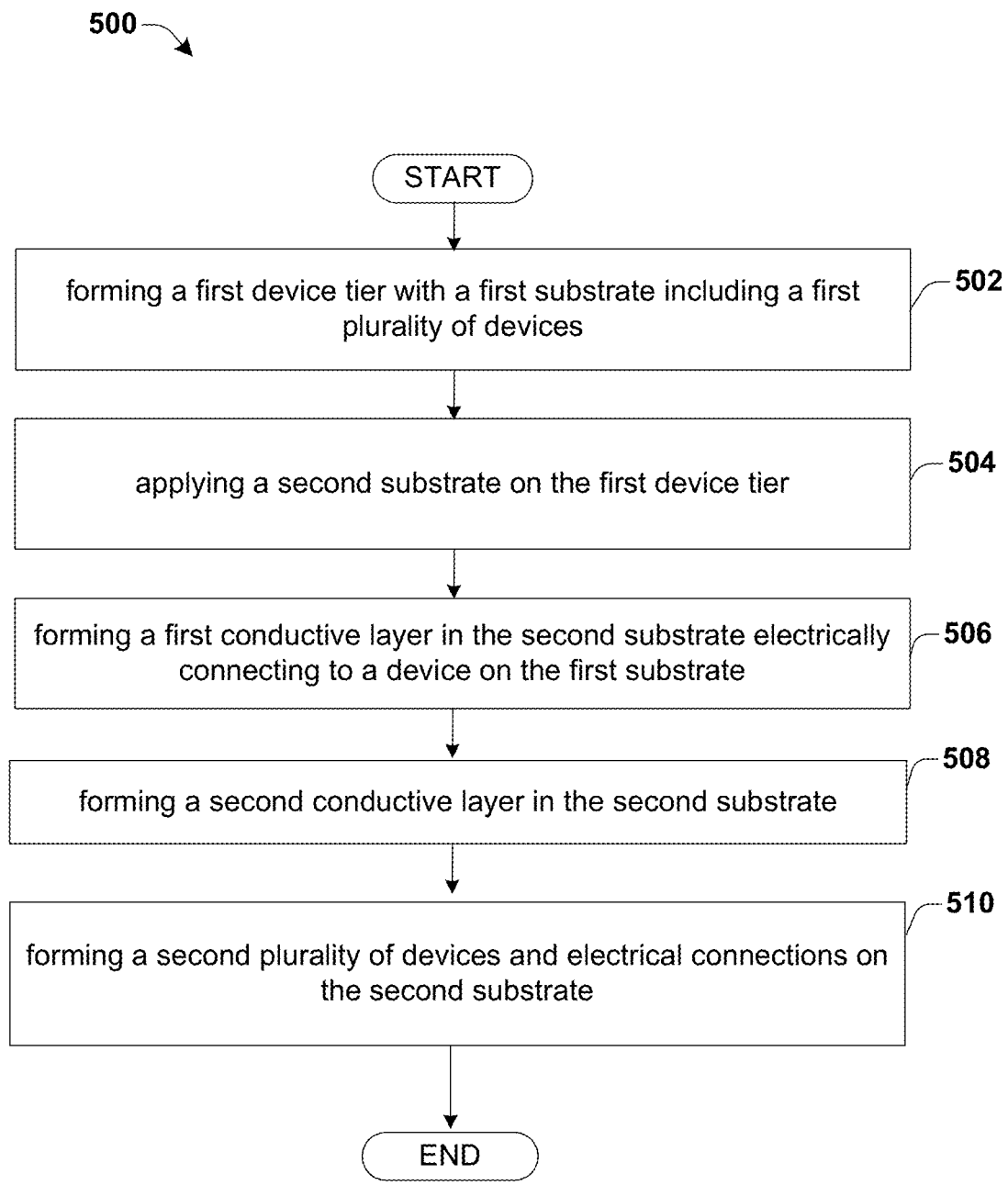
FIG. 5 illustrates a flow diagram of some embodiments of methods for connecting stacked CMOS devices.

FIG. 5 illustrates a flow diagram of some embodiments of methods for connecting stacked CMOS tiers in accordance with some embodiments. While disclosed methods (e.g., methods 500 of FIG. 5) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a first device tier with a first substrate including a first plurality of devices is formed.

At 504, a second substrate is applied on the first device tier.

At 506, a first conductive layer is formed in the second substrate electrically connecting to a device on the first substrate.

At 508, a second conductive layer is formed in the second substrate.

At 510, a second plurality of devices and electrical connections are formed on the second substrate.

One example of FIG. 5's method is now described with regards to a series of cross-sectional views as shown in FIGS. 6a-6e. Although 6a-6e are described in relation to method 500, it will be appreciated that the structures disclosed in FIGS. 6a-6e are not limited to such a method, but instead may stand alone as a structure.

Figure 6A:
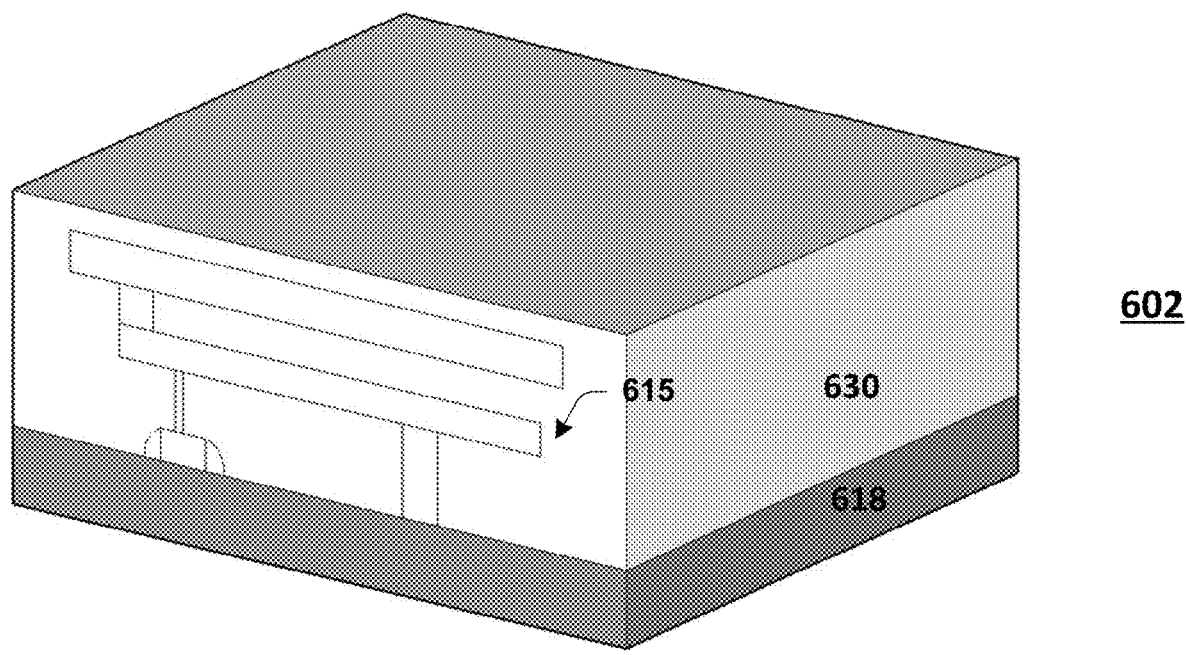
FIGS. 6A-6E illustrate perspective-sectional views of some embodiments of methods for connecting stacked CMOS devices.

At FIG. 6a, a first device tier 602 with a first substrate 618 and a first plurality of devices is formed. An electrical path 615 with multiple layers of metal is formed onto the first substrate inside a dielectric layer 630. The multiple layers of metal can be copper, silver, tungsten or aluminum, for example.

Figure 6B:
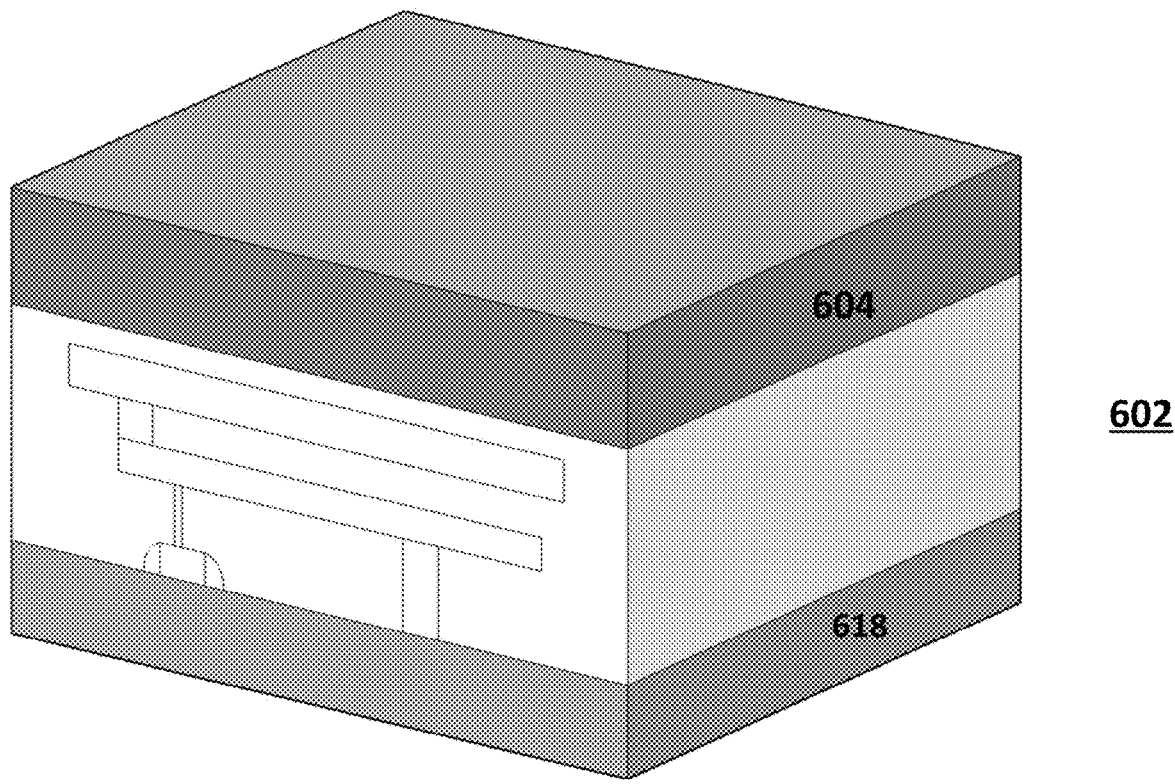

At FIG. 6b, a second substrate 604 is applied on the first device tier 602. The second substrate can be formed by deposition, such as epitaxial deposition for example, or can be bonded to the second device tier 116. For example, in some embodiments, the first device tier can correspond to a first bulk silicon wafer, and the second device tier can correspond to a second bulk silicon wafer, wherein the first wafer has a backside (or topside) that is bonded to the topside of the second bulk silicon wafer.

Figure 6C:
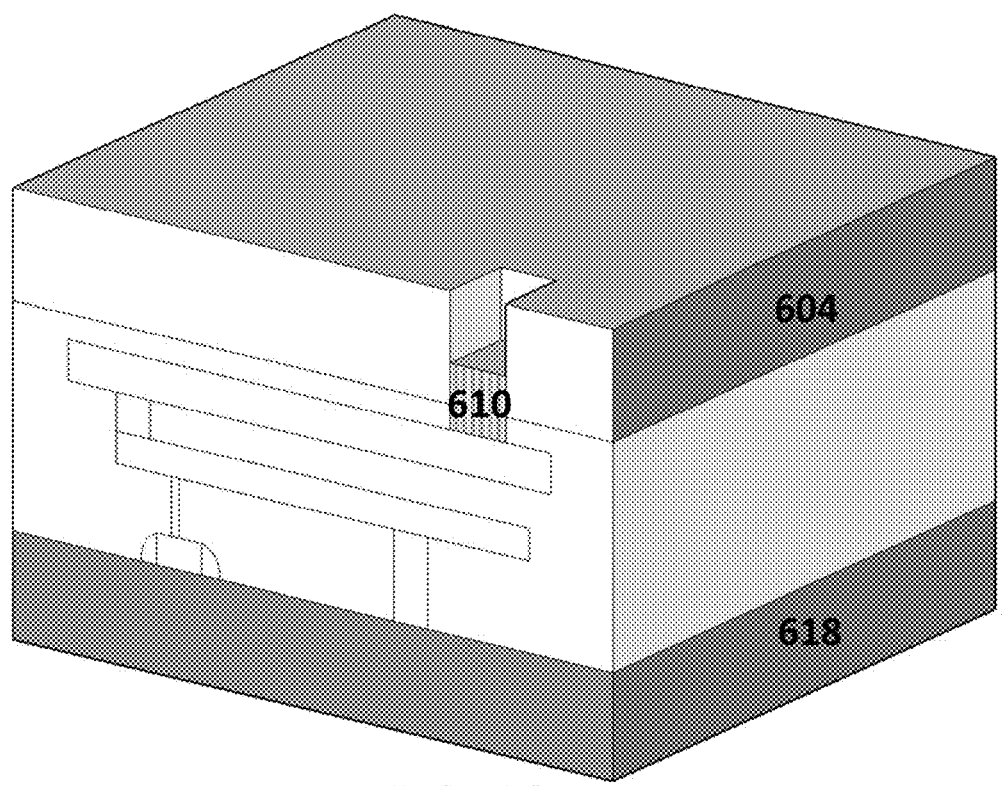

At FIG. 6c, after the second substrate has been applied to the first substrate, a first conductive layer 610 is formed in the second substrate. The first conductive layer 610 electrically connecting to a device on the first substrate 618. For example, the first conductive layer 610 can be copper, silver, tungsten or aluminum with a tantalum (Ta), titanium (Ti), tantalum nitride (TaN), titanium tungsten (TiW), titanium tungsten nitride (TiWN), or titanium nitride (TiN) barrier (not shown) for preventing metal diffusions. A dielectric layer (not shown) is formed surrounding the barrier layer for electrical isolations.

Figure 6D:
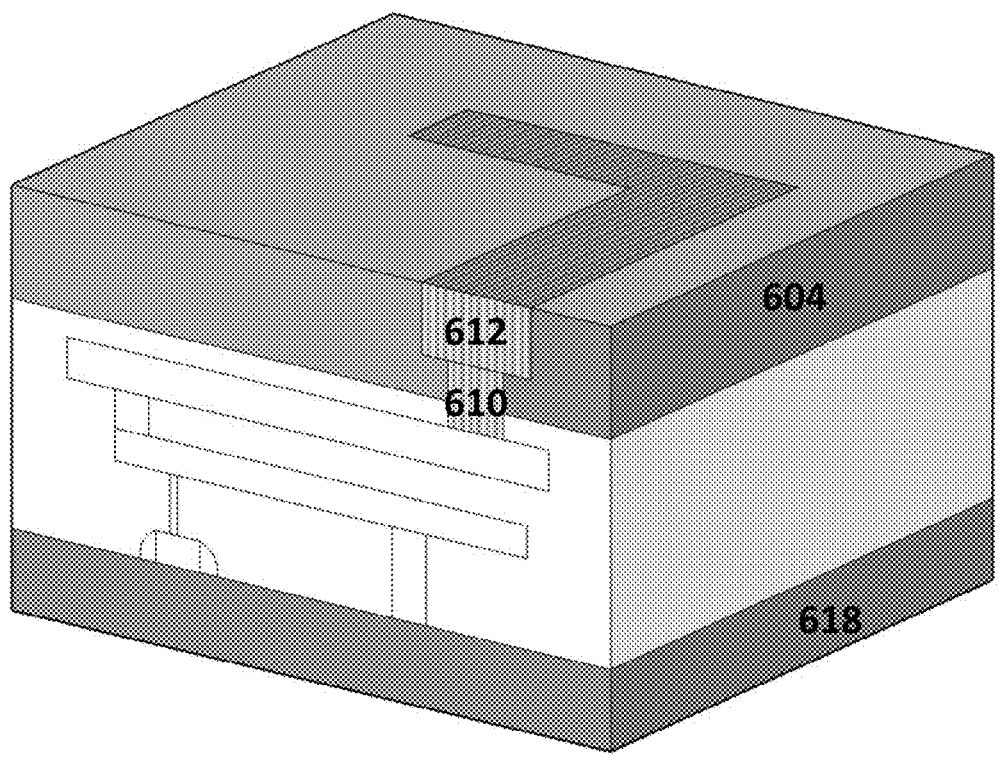

At FIG. 6d, a second conductive layer 612 is formed in the second substrate 604. For example, the second conductive layer 612 can be copper, silver, tungsten or aluminum with a tantalum (Ta), titanium (Ti), tantalum nitride (TaN), titanium tungsten (TiW), titanium tungsten nitride (TiWN), or titanium nitride (TiN) barrier for preventing metal diffusion, and also form dielectric layer surrounding the barrier layer for electrical isolation.

Figure 6E:
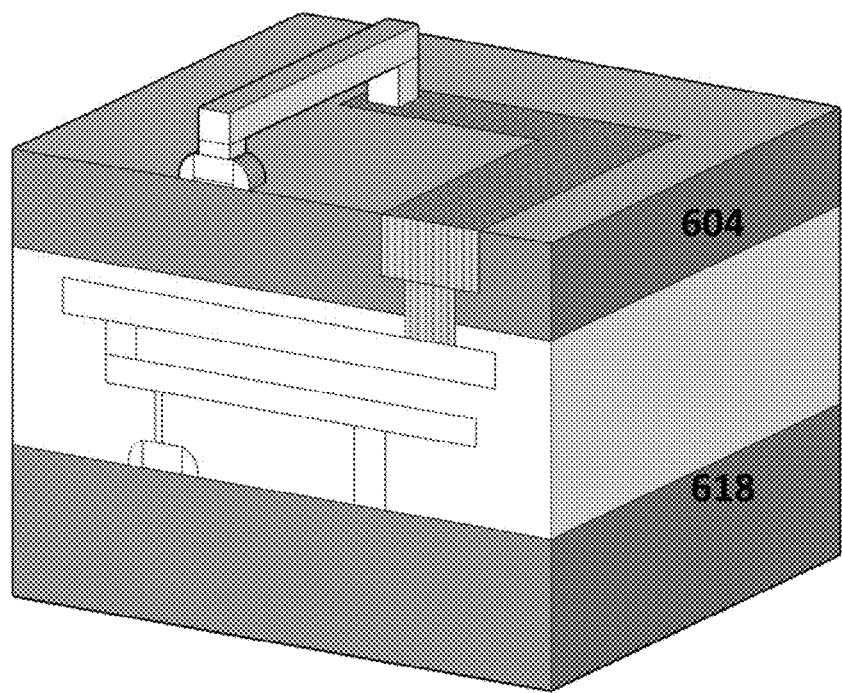

At FIG. 6e, a second plurality of devices and electrical connections are formed on the second substrate. One or more of the second plurality of devices on the second substrate are electrically coupled to one or more of the first plurality of devices on the first substrate.

Thus, the present disclosure relates to an integrated chip having an inter-tier interconnecting structure with horizontal components, which is arranged within a semiconductor substrate and that is configured to electrically couple a first device tier to a second device tier.

In some embodiments, the disclosure relates to an integrated circuit. The integrated chip comprises a first device tier having a first semiconductor substrate. A first inter-tier interconnecting structure is disposed inside the first semiconductor substrate and comprises a first segment extending in a first direction and a second segment protruding outward from a sidewall of the first segment in a second direction substantially perpendicular to the first direction. A second device tier is electrically coupled to the first device tier by the first inter-tier interconnecting structure.

In other embodiments, the disclosure relates to an integrated circuit. The integrated chip comprises a first device tier having a first semiconductor substrate. An inter-tier interconnecting structure is disposed within the first semiconductor substrate. The inter-tier interconnect structure comprises a first connection point at a lower surface of the inter-tier interconnecting structure and a second connection point at an upper surface of the inter-tier interconnecting structure. The first connection point and the second connection point are not vertically aligned. The inter-tier interconnecting structure comprises one or more conductive layers extending between the first and second connection points.

In yet other embodiments, the disclosure relates to an integrated circuit. The integrated chip comprises a first device tier having a first inter-tier interconnecting structure arranged inside a first semiconductor substrate. The first inter-tier interconnecting structure comprises a first conductive layer and a second conductive layer with different patterns. A second device tier is electrically connected to the first device tier by the first inter-tier interconnecting structure.

It will be appreciated that while reference is made throughout this document to exemplary structures in discussing aspects of methodologies described herein (e.g., the structure presented in FIGS. 6a-6e, while discussing the methodology set forth in FIG. 5), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of forming an integrated chip, comprising:
    forming a first device tier including a first semiconductor substrate having a first plurality of devices;
    forming a second semiconductor substrate over the first device tier;
    forming a first conductive layer within the second semiconductor substrate;
    forming a second conductive layer within the second semiconductor substrate and over the first conductive layer, wherein the first conductive layer and the second conductive layer have different patterns as viewed from a top-view and wherein the second conductive layer laterally extends to different distances past opposing outermost sidewalls of the first conductive layer; and
    forming a second plurality of devices on the second semiconductor substrate, wherein the first and second conductive layers are configured to electrically couple the first plurality of devices and the second plurality of devices, and wherein the first conductive layer has an upper surface that continuously and laterally extends past opposing outermost sidewalls of the second conductive layer.

2. The method of claim 1, further comprising:
forming a vertical conductive connection in the second semiconductor substrate to electrically couple the first conductive layer to the second conductive layer.

3. The method of claim 2, wherein the opposing outermost sidewalls of the first conductive layer extend to an outermost surface of the second semiconductor substrate.

4. The method of claim 1, wherein the first conductive layer is a first horizontal connecting structure and wherein the second conductive layer is a second horizontal connecting structure that runs perpendicular to the first conductive layer.

5. The method of claim 1, further comprising:
performing a first etching process on the second semiconductor substrate to form a first opening defined by first sidewalls of the second semiconductor substrate;
forming a first conductive material within the first opening to define the first conductive layer;
performing a second etching process on the second semiconductor substrate to form a second opening defined by second sidewalls of the second semiconductor substrate; and
forming a second conductive material within the second opening to define the second conductive layer.

6. The method of claim 5, wherein the second etching process is performed after forming the first conductive material within the first opening.

7. The method of claim 5, wherein the second opening has a greater width than the first opening.

8. The method of claim 5, wherein the first etching process and the second etching process are performed by exposing a same side of the second semiconductor substrate to one or more etchants.

9. The method of claim 1, wherein the first conductive layer and the second conductive layer are completely confined between a first surface of the second semiconductor substrate and an opposing second surface of the second semiconductor substrate.

10. A method of forming an integrated chip, comprising:
forming a first plurality of conductive interconnect layers within a first dielectric structure formed over a first semiconductor substrate;
attaching a second semiconductor substrate to the first dielectric structure;
performing a first etching process to define a first opening within the second semiconductor substrate;
forming a first conductive material within the first opening;
performing a second etching process to define a second opening within the second semiconductor substrate, wherein the second opening laterally extends from directly over the first opening to past a sidewall of the second semiconductor substrate defining the first opening and wherein the second opening is defined by a first sidewall laterally extending in a first direction and a second sidewall laterally extending in the first direction, the first sidewall being longer than the second sidewall, the first sidewall and the second sidewall both vertically extending to a topmost surface of the second semiconductor substrate along a direction that is perpendicular to the topmost surface; and
forming a second conductive material within the second opening.

11. The method of claim 10, further comprising:
forming a second plurality of conductive interconnect layers over the second semiconductor substrate; and
wherein an inter-tier interconnect structure, comprising the first conductive material and the second conductive material, electrically couples the first plurality of conductive interconnect layers to the second plurality of conductive interconnect layers.

12. The method of claim 11, wherein the inter-tier interconnect structure is configured to contact the first plurality of conductive interconnect layers at a first connection point and to further contact the second plurality of conductive interconnect layers at a second connection point, the first connection point and the second connection point not vertically aligned.

13. The method of claim 10, wherein the second opening has outermost boundaries that define an "L" shape as viewed from a top-view of the second opening.

14. The method of claim 10, wherein the first conductive material is formed within the first opening prior to performing the second etching process.

15. The method of claim 10, wherein the first opening has a different footprint than the second opening.

16. A method of forming an integrated chip, comprising:
forming a plurality of conductive interconnect layers within a dielectric structure formed over a first semiconductor substrate;
attaching a second semiconductor substrate to the dielectric structure;
etching the second semiconductor substrate to form a first trench region defined by first sidewalls of the second semiconductor substrate extending in a first direction and to further form a second trench region defined by second sidewalls of the second semiconductor substrate extending in a second direction intersecting the first direction, wherein the first sidewalls extend in first opposite directions past one of the second sidewalls and the second sidewalls extend in second opposite directions past one of the first sidewalls; and
forming one or more conductive materials within the first trench region and the second trench region.

17. The method of claim 16, wherein the first trench region is vertically separated from the second trench region by way of a vertical conductive connection disposed within the second semiconductor substrate.

18. The method of claim 16,
wherein the dielectric structure is formed along a first surface of the first semiconductor substrate; and
wherein the first opposite directions and the second opposite directions are parallel to the first surface.

19. The method of claim 16, further comprising:
forming a vertical conductive connection in the second semiconductor substrate, wherein the one or more conductive materials within the first trench region contact a top of the vertical conductive connection and laterally extend past an outermost sidewall of the vertical conductive connection.

20. The method of claim 16, wherein the first direction and the second direction are parallel to an interface between the dielectric structure and the first semiconductor substrate.

* * * * *